United States Patent
Konagata et al.

[11] Patent Number: 6,034,853
[45] Date of Patent: Mar. 7, 2000

[54] SOLID STATE RELAY

[75] Inventors: Shoichi Konagata; Yasuo Hayashi, both of Kyoto, Japan

[73] Assignee: Omron Corporation, Kyoto-fu, Japan

[21] Appl. No.: 08/805,628

[22] Filed: Feb. 26, 1997

[30] Foreign Application Priority Data

Mar. 13, 1996 [JP] Japan ................................ 8-055911

[51] Int. Cl.[7] ............................................. H02H 3/22
[52] U.S. Cl. ........................ 361/2; 361/11; 361/56; 361/85; 361/91; 361/111; 361/118
[58] Field of Search .................... 361/2, 6–11, 85–86, 361/56, 58, 118, 126–127, 129–130, 91, 111; 307/127, 128, 130

[56] References Cited

U.S. PATENT DOCUMENTS

| | | | |
|---|---|---|---|
| 3,555,292 | 1/1971 | Henry | 307/133 |
| 4,075,510 | 2/1978 | Pascente | 361/56 |
| 4,594,632 | 6/1986 | Unnewehr | 361/33 |
| 4,849,846 | 7/1989 | Hung et al. | 361/56 |
| 5,162,682 | 11/1992 | Lu | 307/631 |
| 5,339,210 | 8/1994 | Howell | 361/9 |

*Primary Examiner*—Jeffrey A. Gaffin
*Assistant Examiner*—Michael J. Sherry
*Attorney, Agent, or Firm*—Morrison & Foerster LLP

[57] ABSTRACT

A solid state relay prevents the damage to photothyristor couplers when their performance characteristics vary slightly and enables phase angle control of an AC power supply using a less costly configuration than relays with photothyristor couplers having zero-crossing functions. The solid state relay includes a pair of input terminals configured to receive a control signal, a pair of output terminals configured to be connected to an AC power supply, a thyristor in parallel to the pair of output terminals configured to switch the AC power supply in response to the control signal. The solid state relay further includes two photothyristor couplers, each having a photothyristor, that are connected in series at a midpoint connection. The two photothyristor couplers are connected in parallel to the thyristor and are configured to control the thyristor. The solid state relay further includes two surge arresters connected in series at a midpoint connection that is connected to the photothyristor midpoint connection. The two surge arresters are connected in parallel to the pair of output terminals and are configured to block excessive voltage levels.

10 Claims, 4 Drawing Sheets

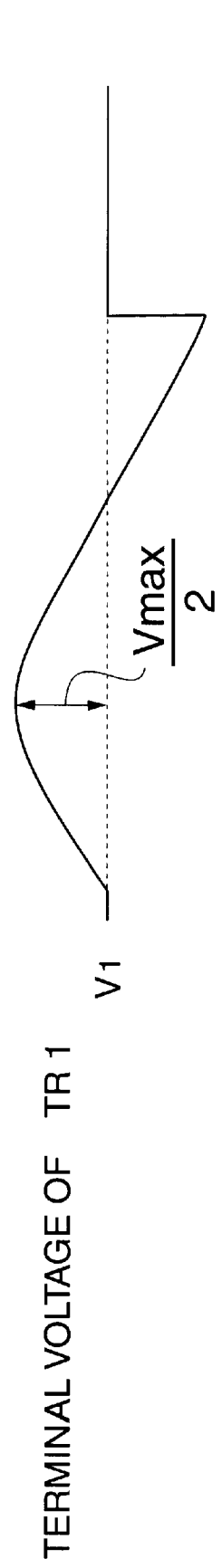
FIG. 2 (a) TERMINAL VOLTAGE OF TR 1
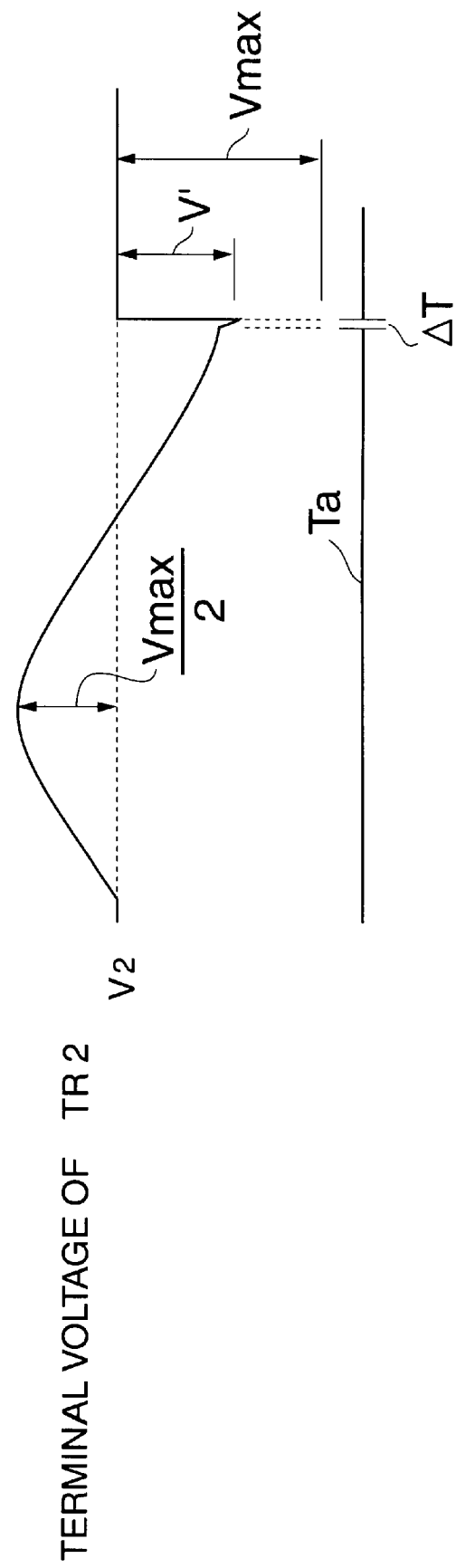
FIG. 2 (b) TERMINAL VOLTAGE OF TR 2

INPUT SIGNAL

VOLTAGE BETWEEN OUTPUT TERMINALS

VOLTAGE BETWEEN OUTPUT TERMINALS

VOLTAGE $V_1$ AT BOTH TERMINALS OF $TR_1$

VOLTAGE $V_2$ AT BOTH TERMINALS OF $TR_2$

10 SOLID STATE RELAY

BACKGROUND OF THE INVENTION

The invention is directed to a solid state electronic relay.

An example of an existing solid state relay is shown in FIG. 3. This solid state relay has two input terminals, $IN_1$ and $IN_2$, and two output terminals, $OUT_1$, and $OUT_2$. Between the input and output terminals are a thyristor THY, two photothyristor couplers, $PHT_1$ and $PHT_2$, a snubber circuit K and a surge arrester SA.

In operation, an input signal is applied to input terminals $IN_1$ and $IN_2$ to control the AC output. AC circuit Z, consisting of AC power supply and load L, is connected to output terminals $OUT_1$ and $OUT_2$. In this example, the input signal applied to input terminals $IN_1$, and $IN_2$ is DC, however, it is also possible to use AC input. The photothyristor couplers $PHT_1$ and $PHT_2$ drive thyristor THY in response to the input signal applied to input terminals $IN_1$ and $IN_2$. In turn, the thyristor THY controls the current flow in AC circuit Z.

Photothyristor couplers $PHT_1$ and $PHT_2$ can both can be turned ON only when the voltage from power supply AC approaches the zero voltage cross-point. The photothyristor couplers have what is known as a zero-crossing function. Each of the photothyristor couplers $PHT_1$ and $PHT_2$ has a built-in zero-crossing detector circuit (not shown), a light emitting diode $D_1$, or $D_2$ as a luminous element, and a photothyristor $TR_1$, or $TR_2$. Light emitting diodes $D_1$ and $D_2$ are connected in series to input terminals $IN_1$ and $IN_2$; photothyristors $TR_1$ and $TR_2$ are connected separately in series to output terminals $OUT_1$ and $OUT_2$.

Snubber circuit K prevents the accidental operation of thyristor THY which might be induced by back current flow when load L is inductive. In this example, the snubber circuit has two resistors, $R_1$ and $R_2$, and two capacitors, $C_1$ and $C_2$ connected in series.

A surge arrester SA, which in this example is a varistor, protects thyristor THY and photothyristors $TR_1$ and $TR_2$ in case an overvoltage is generated by AC circuit Z.

$R_0$ is a resistor which sets the gate current for thyristor THY.

When no DC input signal is applied to input terminals $IN_1$ and $IN_2$ the light emitting diodes $D_1$ and $D_2$ do not emit light. Thus, photothyristors $TR_1$ and $TR_2$ are not conductive, and thyristor THY is off. As such, power is not supplied from power supply AC to load L.

In this state, the voltage from power supply AC is divided between the two photothyristors $TR_1$ and $TR_2$ which are in series. For example, if the voltage of power supply AC is 400 V rms, a voltage of 200 V rms (peak voltage of 282 V) is applied to each of photothyristors $TR_1$ and $TR_2$.

When a DC input signal is applied to input terminals $IN_1$ and $IN_2$, light emitting diodes $D_1$ and $D_2$ in photothyristor couplers $PHT_1$ and $PHT_2$ emit light. Referring to FIG. 4, if the input signal is applied at a point in time when the waveform is not within the region delta V (FIG. 4(b)) of low voltage near the zero-crossing point of the power supply voltage (at time $t_1$ in FIG. 4(b), for example), photothyristors $TR_1$ and $TR_2$ do not turn ON, so thyristor THY does not go ON and power is not supplied from power supply AC to load L.

When the input signal is applied at a point in time when the waveform is within the region delta V of low voltage near the zero-crossing point of the power supply voltage (at time $t_2$ for example), photothyristors $TR_1$ and $TR_2$ will turn ON. Thyristor THY will then turn ON and the power is supplied from power supply AC to load L.

Photothyristors $TR_1$ and $TR_2$ only turn ON when the power supply voltage is in the low-voltage region delta V near the zero crossing point. Thus, a high voltage is never applied to photothyristors $TR_1$ and $TR_2$.

When the input signal applied to input terminals $IN_1$ and $IN_2$ is turned OFF and the power supply voltage falls below the holding current of photothyristors $TR_1$ and $TR_2$ (as at time $t_3$), elements $TR_1$ and $TR_2$ are no longer conductive. Thyristor THY is also no longer conductive, and so the flow of electricity from power supply to load L is cut off.

The conventional solid state relay described above employs photothyristor couplers $PHT_1$ and $PHT_2$ that have zero-crossing functions. Because elements $TR_1$ and $TR_2$ vary somewhat in manufacture, their turn on time is necessarily slightly out of phase. However, because of the zero-crossing function, there is no possibility that elements $TR_1$ and $TR_2$ will be damaged by excessive power from power supply AC.

Photothyristors $TR_1$ and $TR_2$ are protected by the fact that when they are not conductive, the power supply voltage is divided between them, and when they are conductive, the power supply voltage is always near the zero crossing point. The maximum value of the power supply voltage is, therefore, never applied to either photothyristor $TR_1$ or $TR_2$.

However, in a conventional relay, such as the one shown in FIG. 3, the phase angle at which the AC power supply switches ON and OFF cannot be controlled, due to the zerocrossing function.

This poses a problem, since there are a number of devices in which it is necessary to control the phase angle at which AC power is applied, such as motor controllers or dimmers. As discussed above, in a relay that employs photothyristor couplers $PHT_1$ and $PHT_2$ with zero-crossing functions (FIG. 3), when an input signal is applied to input terminals $IN_1$ and $IN_2$ the output terminals $OUT_1$ and $OUT_2$ do not immediately conduct, but rather conduct depending on the position of the supply voltage waveform.

It would be conceivable to address this problem by substituting elements without a zero-crossing function for photothyristor couplers $PHT_1$ and $PHT_2$ in the solid state relay shown in FIG. 3. If this were done, output terminals $OUT_1$ and $OUT_2$ would immediately conduct when an input signal is applied to input terminals $IN_1$ and $IN_2$, regardless of the phase angle of the AC waveform. In this way the phase of switching could be controlled.

However, if photothyristor couplers $PHT_1$ and $PHT_2$ are used which completely lack a zero-crossing function, the following problem arises. Assuming that the voltages at both terminals of photothyristors $TR_1$ and $TR_2$ are $V_1$ and $V_2$ respectively, and that photothyristors $TR_1$ and $TR_2$ are both OFF, as shown in FIG. 5 (the period labeled $T_a$) the voltage from the AC power supply is divided between photothyristors $TR_1$ and $TR_2$, and so is not applied in full to either of the photothyristors. Even if the supply voltage is at its maximum value $V_{max}$, the terminal voltage on either photothyristor will be $V_1=V_2=V_{max}/2$.

One of photothyristor couplers $PHT_1$, and $PHT_2$ will, in general, have a time lag, delta T, in its turn on time due to variations in its performance characteristics caused by the manufacturing process, as mentioned above. If thyristor $TR_1$ turns ON slightly ahead of photothyristor $TR_2$ and the supply voltage is in the vicinity of its maximum value, then the maximum voltage $V_{max}$ will be applied momentarily to photothyristor $TR_2$ alone. The voltage across the photothyristor $TR_2$, $V_2$, will then go to $V_{max}$, and element $TR_2$ will be damaged.

To prevent photothyristors $TR_1$ and $TR_2$ from being damaged in this way, elements with breakdown voltages sufficiently higher than the maximum value $V_{max}$ of the power supply voltage are needed.

For example, if the voltage of the AC power supply is 400 V rms, zero-crossing function photothyristor couplers $PHT_1$ and $PHT_2$ each with a breakdown voltage of 600 V could be used. If photothyristor couplers $PHT_1$ and $PHT_2$ without a zero-crossing function are used, however, they would each need to have a breakdown voltage of 1200 V, which would drive up the cost of the relay.

SUMMARY OF THE INVENTION

The invention provides a solid state relay (SSR) with a protective circuit to protect photothyristors from damage when high voltage is applied. The invention is especially applicable for relays that have photothyristors that lack a zero-crossing function, which, in general, are less expensive than those having the zero-crossing function.

The invention prevents photothyristors used in a solid state relay from being damaged when the photothyristors have different performance characteristics. It also makes it possible to provide phase-controlled switching using an economical construction that employs photothyristor couplers without zero-crossing functions.

The invention includes a solid state relay having: input terminals to which a signal is applied to control the output switching of an AC power supply; thyristors that switch the output of the AC power supply and are connected between the input terminals and between the output terminals connected to the aforesaid AC power supply; and two photothyristor couplers, which drive the thyristor in response to the aforesaid input signal. The luminous elements and photothyristors which comprise the two photothyristor couplers are connected, respectively, in series on the input terminal side and the output terminal side.

One of the distinguishing features of this invention is that a series combination of two surge arresters is connected in parallel to the output terminals and a short circuit is provided between the midpoint connection of the two surge arresters and the midpoint connection of the two input photothyristors.

BRIEF DESCRIPTION OF THE DRAWING

FIG. 2 is a waveform diagram illustrating the terminal voltages applied to the photothyristors in the solid state relay.

DESCRIPTION

Figure 1:
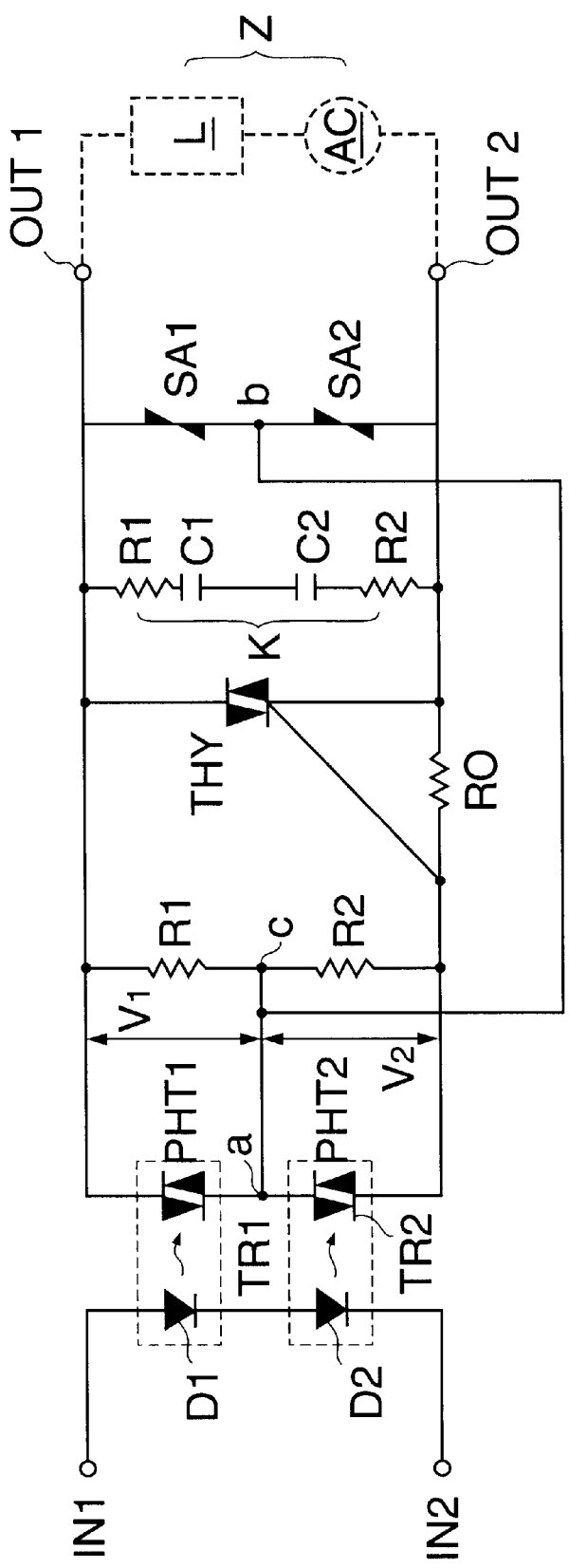
FIG. 1 is a circuit diagram of a solid state relay.

FIG. 1 shows a circuit diagram of a solid state relay, in which Z is the AC circuit; L is the load; AC is the AC power supply; $IN_1$ and $IN_2$ are input terminals to which an input signal is applied to control the current flow in the AC output circuit; $OUT_1$ and $OUT_2$ are the output terminals connected to AC circuit Z; THY is a thyristor which switches AC circuit z; K is a snubber circuit to prevent the accidental operation of thyristor THY; $R_1$, $R_2$, $C_1$ and $C_2$ are the resistors and capacitors comprising snubber circuit K; and $R_0$ is a resistor to set the gate current to thyristor THY.

In this embodiment, two photothyristors $PHT_1$ and $PHT_2$ drive thyristor THY according to an input signal. In contrast to conventional relays, photothyristors $PHT_1$ and $PHT_2$ do not have a zero-crossing function. Thus, they can turn ON immediately regardless of the phase angle of the voltage waveform from the AC power supply. The light emitting diodes $D_1$ and $D_2$ which constitute photothyristor couplers $PHT_1$ and $PHT_2$ are connected in series with input terminals $IN_1$ and $IN_2$; photothyristors $TR_1$ and $TR_2$ are connected in series with output terminals $OUT_1$ and $OUT_2$.

Also in this embodiment, two surge arresters $SA_1$ and $SA_2$ connected in series with one another are connected in parallel with output elements $OUT_1$ and $OUT_2$. Resistors $R_1$ and $R_2$ connected in series with one another, act as a voltage divider and are connected in parallel with photothyristors $TR_1$ and $TR_2$. A short circuit is provided from the midpoint a between the resistors and the two photothyristors $TR_1$ and $TR_2$ to the midpoint b between the two surge arresters $SA_1$ and $SA_2$.

In this example, surge arresters $SA_1$ and $SA_2$ are varistors, although arrester tubes could also be used. The series circuit of surge arresters $SA_1$ and $SA_2$ serves to protect thyristor THY and photothyristors $TR_1$ and $TR_2$ from overvoltage generated by any back current in circuit Z. Surge arrester $SA_2$ prevents photothyristors $TR_1$ and $TR_2$ from being damaged as a result of any differential in their Turn on time.

Resistors $R_1$ and $R_2$ supplement the action of surge arresters $SA_1$ and $SA_2$. Since the two resistors having the midpoint c divide the voltage, excessive voltage will not be applied to either of photothyristors $TR_1$ and $TR_2$ even if there is a differential in their Turn on time. In this example, photothyristor couplers $PHT_1$ and $PHT_2$ are identical, so resistors $R_1$ and $R_2$ have the same resistance value.

The photothyristors $PHT_1$ and $PHT_2$ used in the relay shown in FIG. 1 are the type which do not have a zero-crossing function. Thus, they can turn ON immediately in response to an input signal and drive thyristor THY, regardless of the phase angle of the voltage waveform from the AC power supply.

There may be a differential, delta T, in the turn on time of photothyristor couplers $PHT_1$ and $PHT_2$ due to a variation in their performance characteristics caused by the manufacturing process. This differential leads to variations in the voltage applied to photothyristor couplers $PHT_1$ and $PHT_2$, as shown in FIG. 2, however, the invention limits such variations, as described below.

For example, if photothyristors $TR_1$ and $TR_2$ are both off (time period $T_a$) the supply voltage from the AC power supply is divided between $TR_1$ and $TR_2$ ($V_1$ and $V_2$). The full voltage is not applied to either of the photothyristors $TR_1$ and $TR_2$. Even when the power supply voltage is at its maximum value $V_{max}$, the terminal voltages will still be $V_1=V_2=V_{max}/2$.

If an input signal is applied to input terminals $IN_1$ and $IN_2$, photothyristor $TR_1$ may turn ON before photothyristor $TR_2$ by a time period of delta T. If the voltage from the AC power supply is in the vicinity of its maximum value $V_{max}$, the maximum voltage $V_{max}$ is divided by resistors $R_1$ and $R_2$ and a lower voltage will be actually applied to photothyristor $TR_2$.

In addition, if a high voltage threatens to be applied to a photothyristor, such as $TR_2$, due to a differential in turn on time, the resistance value of surge arrester $SA_2$ decreases, and the current flows through the photothyristor that turns ON first, $TR_1$, through surge arrester $SA_2$. As a result, the voltage applied to the terminals of photothyristor $TR_2$ is voltage V', which is sufficiently lower than the maximum voltage $V_{max}$ of the AC power supply, as shown in FIG. 2. If photothyristor $TR_2$ were to turn ON before photothyristor $TR_1$ by a period of delta T, the same situation would apply.

Figure 3:
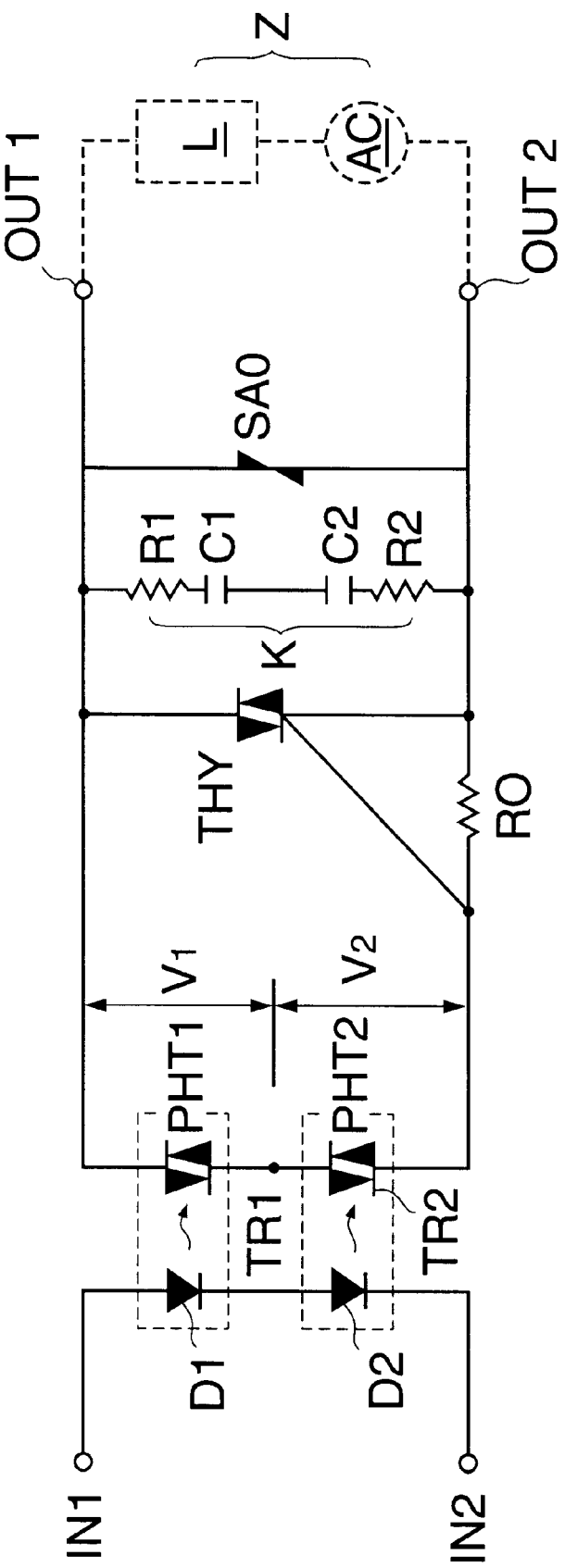
FIG. 3 is a circuit diagram of a conventional solid state relay.
Figure 4A:
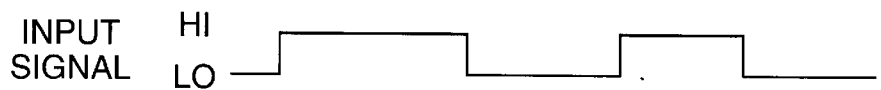
FIG. 4 is a waveform diagram showing the relationship between the input signal and the voltage between the output terminals in the solid state relay of FIG. 3.
Figure 4B:
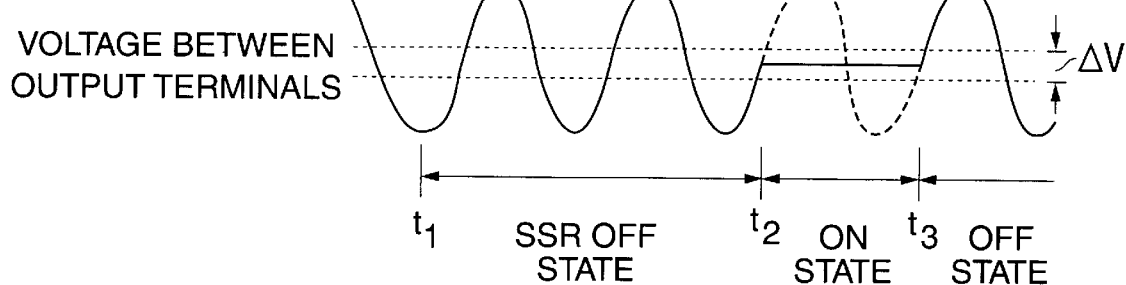
Figure 5A:
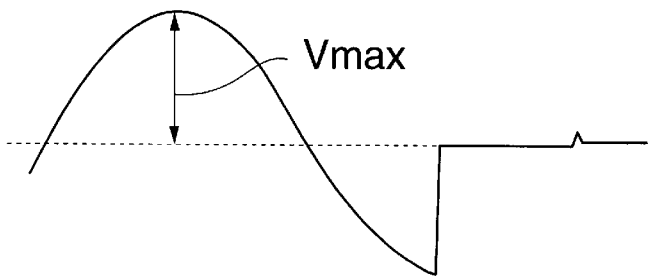
FIG. 5 is a waveform diagram showing the relationship between the voltage between the output terminals in the solid state relay of FIG. 3 and the terminal voltages applied to the two photothyristors.
Figure 5B:
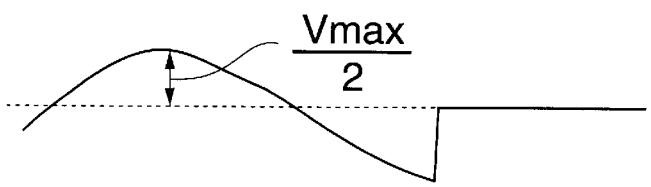
Figure 5C:
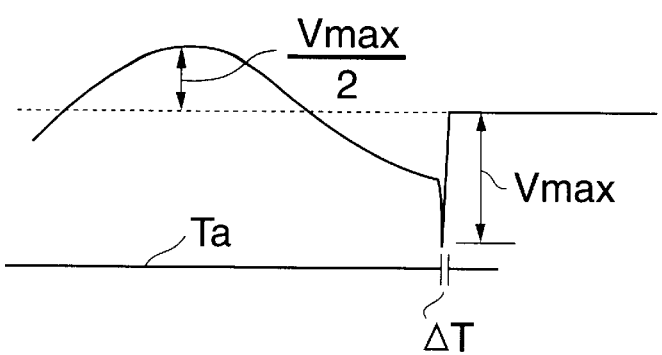

As explained above, the invention allows photothyristor couplers that do not have zero-crossing functions and have lower breakdown voltages to be employed. The required breakdown voltage is approximately the same as that required for photothyristor couplers with zero-crossing functions used in conventional relays, such as that shown in FIG. 3.

For example, if the voltage of the AC power supply is 400 V rms, and photothyristors $PHT_1$, and $PHT_2$ without a zero-crossing function are used without the short circuit, components must be used which have a breakdown voltage of 1200 V, as was discussed above. On the contrary, the circuit in the embodiment shown in FIG. 1 uses photothyristors $PHT_1$ and $PHT_2$ without a zero crossing function, yet it can get by using components with a breakdown voltage of 600 V.

In addition to above, even if surge arresters $SA_1$ and $SA_2$ for the 200 V system which is half of 400 V, as a set they constitute a 400 V system, which can adequately protect thyristor THY.

In the embodiment pictured in FIG. 1, photothyristor couplers $PHT_1$ and $PHT_2$ do not have a zero crossing function. However, this invention could obviously also be applied if these components had a zero crossing function. Also, although in this embodiment the input signal applied to terminals $IN_1$ and $IN_2$ is a DC signal, the invention would also apply if an AC signal were used.

In the solid state relay of this invention, if there is a differential in the turn on time of the two photothyristor couplers due to variations in their characteristics occurring during manufacture, overvoltage applied to one of the photothyristors will be absorbed by a surge arrester to effectively prevent the photothyristor from being damaged.

Thus phase angle control can be realized using cheaper photothyristor couplers with no zero crossing function.

What is claimed is:

1. A solid state relay, comprising:
    a pair of input terminals configured to receive a control signal;
    a pair of output terminals configured to be connected to an AC circuit, the AC circuit comprising a load and an AC power supply;
    a thyristor in parallel to the pair of output terminals and configured to switch the AC power supply in response to the control signal;
    two photothyristor couplers connected in series at a first midpoint connection, wherein the two photothyristor couplers are connected in parallel to the thyristor and are configured to control the thyristor, each photothyristor coupler comprising a photothyristor; and
    two surge arresters connected in series at a second midpoint connection, wherein the two surge arresters are connected in parallel to the pair of output terminals, the two surge arresters being configured to protect the thyristor and the two photothyristor couplers from an excessive voltage level generated by a back current from the AC circuit,
    wherein the first midpoint connection is connected to the second midpoint connection.

2. A solid state relay according to claim 1, wherein the two photothyristor couplers are configured to be operable at all possible values of AC voltage phase.

3. A solid state relay according to claim 1, wherein the two photothyristor couplers comprise zero-crossing detection circuits.

4. A solid state relay according to claim 1, wherein the control signal received at the pair of input terminals controls a phase angle of the AC power supply.

5. A solid state relay according to claim 1, wherein the photothyristor coupler comprises a photothyristor connected to the thyristor and a light emitting diode connected to the pair of input terminals.

6. A solid state relay according to claim 1, wherein the surge arrester is a varistor.

7. A solid state relay according to claim 1, wherein the surge arrester is an arrester tube.

8. A solid state relay according to claim 1, further comprising a resistor connected to the photothyristor configured to divide a voltage load generated by the AC power supply.

9. A solid state relay according to claim 1, wherein the thyristor comprises a three terminal device.

10. A solid state relay according to claim 1, further comprising two resistors connected in series at a third midpoint connection, the two resistors being connected in parallel to the thyristor and being configured to divide an AC voltage generated by the AC power supply, wherein the third midpoint connection is connected to the first midpoint connection.

* * * * *